(12) United States Patent
Yang

(10) Patent No.: US 11,889,644 B2
(45) Date of Patent: Jan. 30, 2024

(54) HINGE ASSEMBLY AND ELECTRONIC DEVICE

(71) Applicant: BEIJING XIAOMI MOBILE SOFTWARE CO., LTD., Beijing (CN)

(72) Inventor: Jieming Yang, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 17/566,454

(22) Filed: Dec. 30, 2021

(65) Prior Publication Data

US 2023/0050832 A1 Feb. 16, 2023

(30) Foreign Application Priority Data

Aug. 12, 2021 (CN) .......................... 202110926283.2

(51) Int. Cl.
| H05K 5/02 | (2006.01) |
| H05K 5/00 | (2006.01) |
| F16C 11/04 | (2006.01) |
| E05D 3/18 | (2006.01) |
| E05D 11/06 | (2006.01) |
| E05D 1/06 | (2006.01) |

(52) U.S. Cl.
CPC ............ *H05K 5/0226* (2013.01); *F16C 11/04* (2013.01); *H05K 5/0017* (2013.01); *E05D 1/06* (2013.01); *E05D 3/18* (2013.01); *E05Y 2900/606* (2013.01)

(58) Field of Classification Search
None
See application file for complete search history.

(56) References Cited

U.S. PATENT DOCUMENTS

| 2015/0160695 A1* | 6/2015 | Su .......................... G06F 1/1681 16/366 |
| 2018/0309861 A1* | 10/2018 | Lin ....................... G06F 1/1681 |
| 2019/0250676 A1 | 8/2019 | Lin et al. |
| 2020/0103935 A1 | 4/2020 | Hsu |
| 2021/0307186 A1* | 9/2021 | Hong .................... G06F 1/1616 |

FOREIGN PATENT DOCUMENTS

| CN | 112019664 A | 12/2020 |
| CN | 113067924 A | 7/2021 |
| CN | 113067924 A | * 7/2021 ............ H04M 1/022 |

OTHER PUBLICATIONS

Extended European Search Report issued in Application No. 21218457.6, dated Jun. 13, 2022,(10p).

* cited by examiner

Primary Examiner — James Wu
Assistant Examiner — Christopher L Augustin
(74) Attorney, Agent, or Firm — Arch & Lake LLP

(57) ABSTRACT

The hinge assembly includes: a rotating assembly and a hovering mechanism. The rotating assembly includes a first rotating part, and the first rotating part comprises a first guide groove extending obliquely around an axial direction of the first rotating part. The hovering mechanism comprises a sliding member and a position limiting member. The sliding member includes a protruding part, the protruding part extends into the first guide groove. The first rotating part drives the sliding member to move along the axial direction of the first rotating part when rotating. One of the position limiting member and the sliding member comprises a first limiting part, the other of the position limiting member and the sliding member comprises a second limiting part cooperated with the first limiting part.

18 Claims, 7 Drawing Sheets

HINGE ASSEMBLY AND ELECTRONIC DEVICE

The present application is based on and claims the priority to the Chinese Patent Application No. 202110926283.2, filed on Aug. 12, 2021, the entire contents of which are hereby incorporated by reference for all purposes.

TECHNICAL FIELD

The present disclosure relates to the technical field of terminals, and in particular to a hinge assembly and an electronic device.

BACKGROUND

With the development of flexible OLED display technology and foldable electronic devices that combine the portability of ordinary electronic devices and the ultimate experience of large-screen display after unfolding, foldable electronic devices have gradually become an important trend in the development of mobile terminals, and have become an important area for the major terminal manufacturers to compete.

However, the state switching of the current foldable electronic device mainly relies on the hinge assembly, and the folding and unfolding of the hinge assembly drives the electronic device to fold and unfold.

SUMMARY

The present disclosure provides a hinge assembly and an electronic device to solve the deficiencies in the related art.

According to the first aspect of the present disclosure, there is provided a hinge assembly, including: a rotating assembly and a hovering mechanism. The rotating assembly includes a first rotating part, and the first rotating part includes a first guide groove extending obliquely around an axial direction of the first rotating part. The hovering mechanism includes a sliding member and a position limiting member, the sliding member includes a protruding part, the protruding part extends into the first guide groove, and the first rotating part drives the sliding member to move along the axial direction of the first rotating part when rotating, the position limiting member includes a first limiting part, and the sliding member includes a second limiting part cooperated with the first limiting part. Rotation of the first rotating part is limited when the first limiting part is cooperated with the second limiting part, and the limiting is released when the first limiting part is separated from the second limiting part.

According to the second aspect of the present disclosure, there is provided an electronic device, including: a housing and a flexible screen; the hinge assembly according to any one of the above, wherein an end of the rotating assembly away from the first rotating part is used to be connected to the housing to drive the housing to rotate.

It should be noted that the above general description and the following detailed description are merely exemplary and explanatory, and should not be construed as limiting of the present disclosure.

BRIEF DESCRIPTION OF THE DRAWINGS

The drawings herein are incorporated into the specification and constitute a part of the specification, show embodiments in accordance with the present disclosure, and are used to explain the principle of the present disclosure together with the specification.

DETAILED DESCRIPTION

The exemplary embodiments will be described in detail herein, and examples thereof are shown in the accompanying drawings. When the following description refers to the drawings, unless otherwise indicated, the same numbers in different drawings indicate the same or similar elements. The implementation manners described in the following exemplary embodiments do not represent all implementation manners consistent with the present disclosure. On the contrary, they are merely examples of apparatuses and methods consistent with some aspects of the present disclosure as detailed in the appended claims.

The terms used in the present disclosure are only for the purpose of describing specific embodiments, and are not intended to limit the present disclosure. The singular forms of "a", "said" and "the" used in the present disclosure and appended claims are also intended to include plural forms, unless the context clearly indicates other meanings. It should also be understood that the term "and/or" as used herein refers to and includes any or all possible combinations of one or more associated listed items.

It should be understood that although the terms first, second, third, etc. may be used in this disclosure to describe various information, the information should not be limited to these terms. These terms are only used to distinguish the same type of information from each other. For example, without departing from the scope of the present disclosure, the first information may also be referred to as second information, and similarly, the second information may also be referred to as first information. Depending on the context, the word "if" as used herein can be interpreted as "when" or "at the time of" or "in response to determining".

Figure 1:
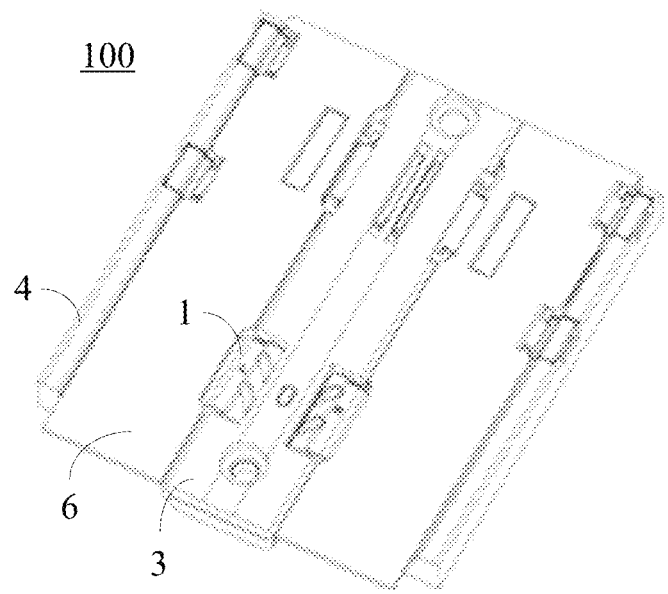
FIG. 1 is a schematic structural diagram of a hinge assembly in a flattened state according to an exemplary embodiment.
Figure 2:
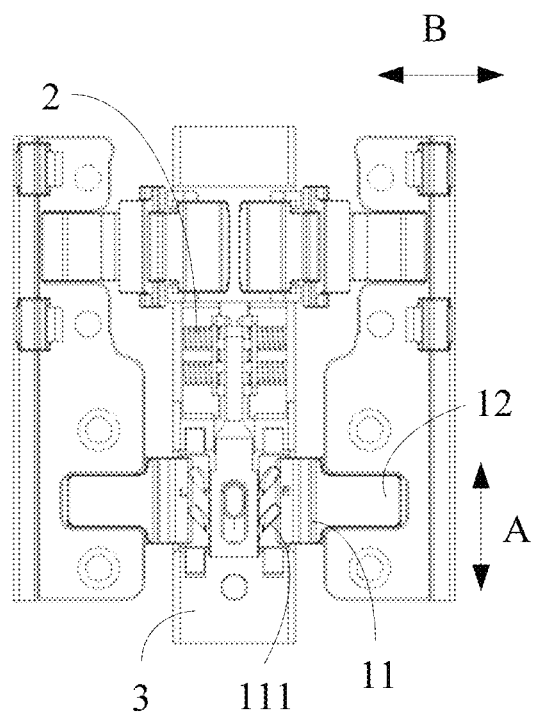
FIG. 2 is a partial structural diagram of the hinge assembly in FIG. 1.
Figure 3:
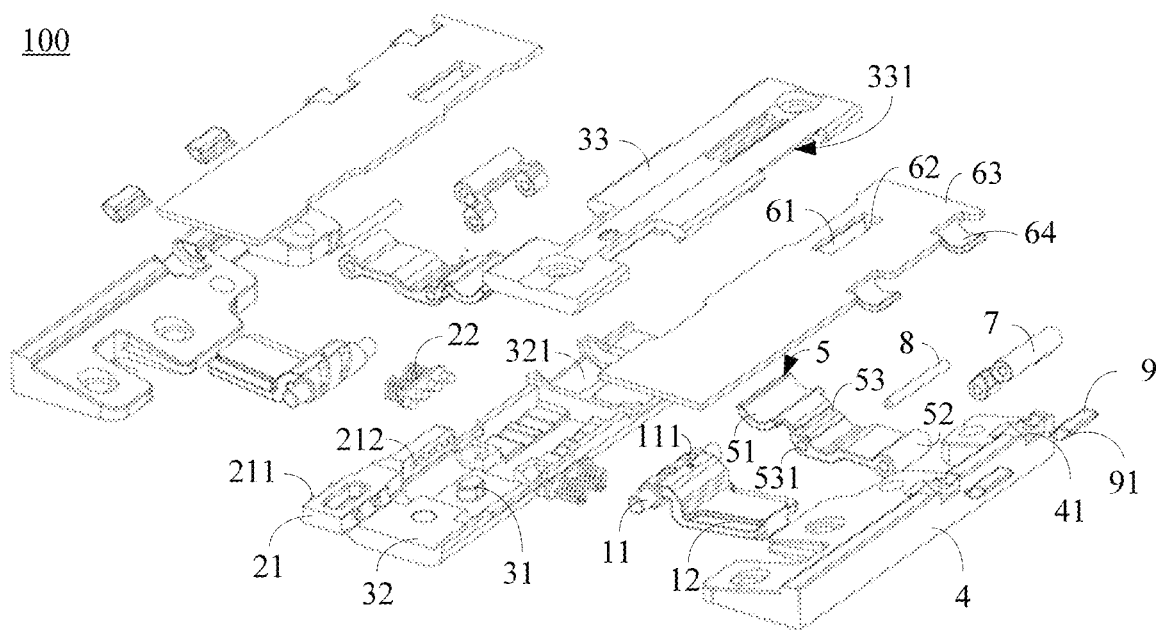
FIG. 3 is an exploded schematic diagram showing a hinge assembly according to an exemplary embodiment.

FIG. 1 is a schematic structural diagram of a hinge assembly 100 in a flattened state according to an exemplary embodiment, FIG. 2 is a partial structural schematic diagram of the hinge assembly 100 in FIG. 1, and FIG. 3 is an exploded schematic diagram showing a hinge assembly 100 according to an exemplary embodiment. As shown in FIGS. 1 to 3, the hinge assembly 100 may include a rotating assembly 1 and a hovering mechanism 2. The rotating assembly 1 may include a first rotating part 11. An axial direction of the first rotating part 11 may be arranged along the direction shown by arrow A in FIG. 2. The first rotating part 11 may include a first guide groove 111 extending obliquely around the axial direction of the first rotating part 11. Specifically, the first guide groove 111 may be a spiral groove around the axial direction, or a spiral groove partially surrounding along the axial direction of the first rotating part 11. The same first rotating part 11 may include one or more first guide grooves 111, which is not limited in the present disclosure. The hovering mechanism 2 may include a sliding member 21 and a position limiting member 22. The sliding member 21 may include a protruding part 211 extending toward the first rotating part 11. The protruding part 211 can extend into the first guide groove 111, so as to drive the sliding member 21 to move along the axial direction of the first rotating part 11 through the cooperation of the first guide groove 111 and the protruding part 211 when the first rotating part 11 rotates in an axial direction. The position limiting member 22 may include a first limiting part 221. The sliding member 21 may include a second limiting part 212. The second limiting part 212 may move toward the first limiting part 221 when the sliding member 21 moves along the axial direction of the first rotating part 11, until the cooperation of the first limiting part 221 and the second limiting part 212 can restrict the rotation of the first rotating part 11, such that the hinge assembly 100 can be maintained in the current state, for example, it can be maintained in the bent state or the unfolded state. When the first limiting part 221 and the second limiting part 212 are separated, the first rotating part 11 can continue to rotate around the axis to switch the state of the hinge assembly 100. For example, it can bend the hinge assembly 100 or unfold the hinge assembly 100, which is not limited by the present disclosure.

Based on this, through the coordinated position limiting effect between the first limiting part 221 and the second limiting part 212 of the hovering mechanism 2, the rotation of the rotating assembly 1 can be restricted to maintain the hinge assembly 100 at the target position. Therefore, when the hinge assembly 100 is applied to a foldable electronic device subsequently, the foldable electronic device can be maintained in a target bending state, which enriches the folding manner of the foldable electronic device.

In the embodiment provided by the present disclosure, the first limiting part 221 includes projections arranged side by side along the axial direction of the first rotating part 11, and the second limiting part 212 includes a plurality of recessed parts arranged side by side along the axial direction of the first rotating part 11. During the sliding process of the sliding member 21, the first rotating part 11 can be restricted when at least a part of the projection is located in the recessed part; and if the sliding member 21 is driven to continue sliding under the action of an external force, the projection can slide out from the current recessed part and be cooperated into another recessed part, and at this time, the hinge assembly 100 can be limited to another angle. That is, when the same projection is cooperated with different recessed parts to limit the position, the first rotating part 11 can be limited to different angles, so that the hinge assembly 100 is limited to different target bending positions. The greater the number of projections and recessed parts is, the more angles that can limit the first rotating part 11 will be, and at the same time, multiple sets of mutually cooperated projections and recessed parts can improve the stability of limiting the first rotating part 11 at the target angle. In some other embodiments, the first limiting part 221 may also include a single projection, and the second limiting part 212 includes a plurality of recessed parts, which can also achieve the multi-angle position limiting of the first rotating part 11. Alternatively, the first limiting part 221 may also include a plurality of projections, and the second limiting part 212 includes a single recessed part, which can also achieve the multi-angle position limiting of the first rotating part 11. Alternatively, in some other embodiments, in the case where the requirement of the limiting angle of the first rotating part 11 is not high, it may also be that the first limiting part 221 includes a single projection, and the second limiting part 212 includes a single recessed part, so as to achieve limiting the first rotating part 11 in a single angle.

Figure 4:
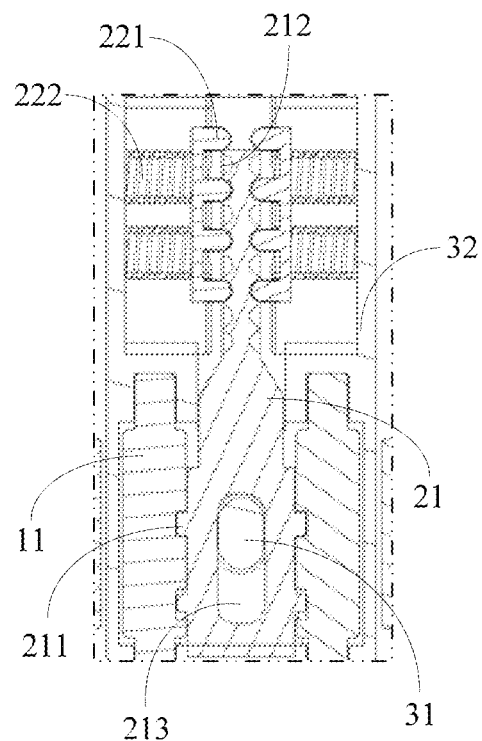
FIG. 4 is a partial cross-sectional schematic diagram showing a hinge assembly in a first state according to an exemplary embodiment.
Figure 5:
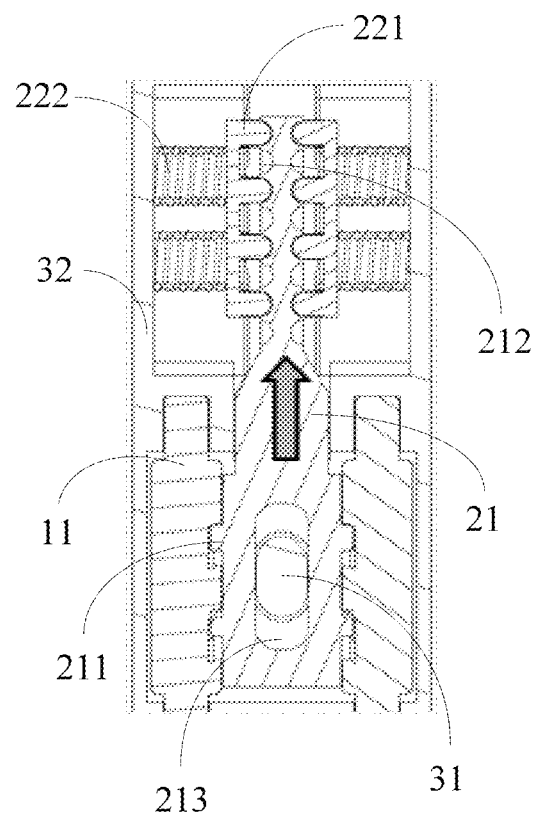
FIG. 5 is a partial cross-sectional schematic diagram showing a hinge assembly in a second state according to an exemplary embodiment.
Figure 6:
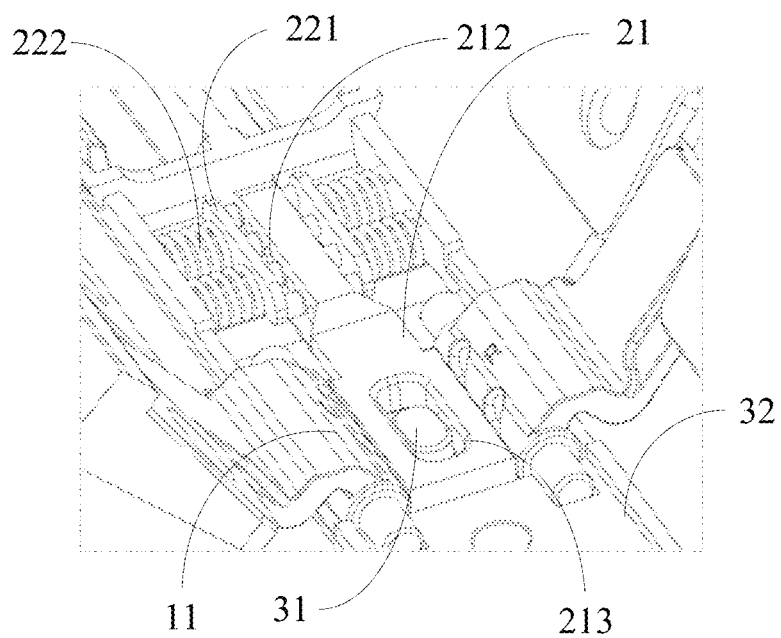
FIG. 6 is a partial three-dimensional schematic diagram of the hinge assembly in a second state in FIG. 5.
Figure 7:
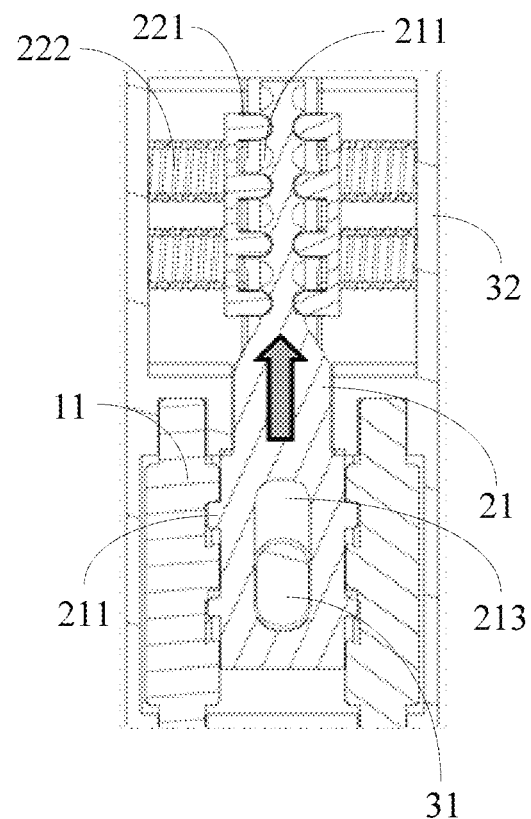
FIG. 7 is a schematic partial cross-sectional view of a hinge assembly in a third state according to an exemplary embodiment.
Figure 8:
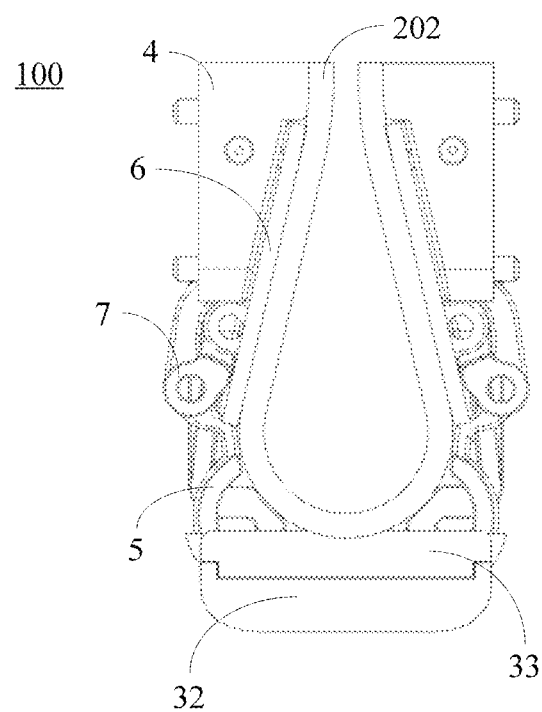
FIG. 8 is a schematic structural diagram showing a hinge assembly in a folded state according to an exemplary embodiment.
Figure 9:
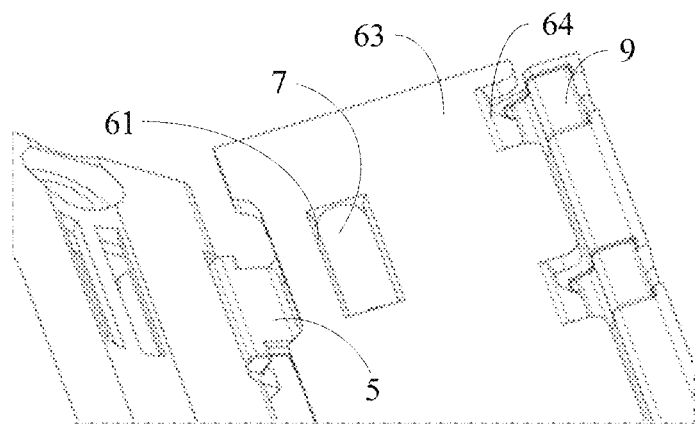
FIG. 9 is a partial schematic diagram showing a hinge assembly according to an exemplary embodiment.
Figure 10:
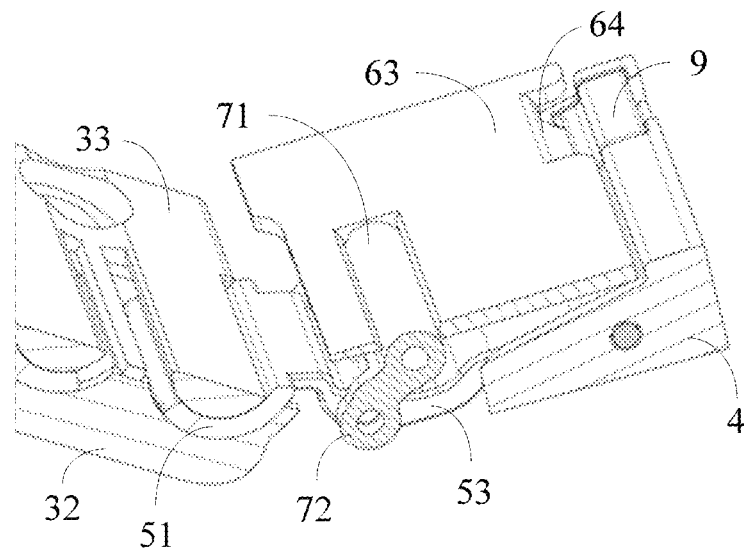
FIG. 10 is a schematic partial cross-sectional view of a hinge assembly according to an exemplary embodiment.
Figure 11:
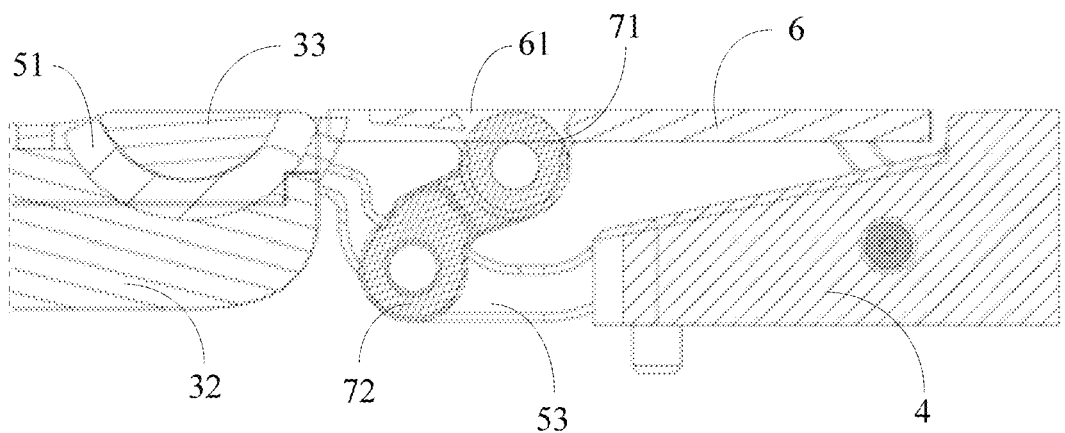
FIG. 11 is a partial cross-sectional schematic diagram showing a hinge assembly in an unfolded state according to an exemplary embodiment.

The present disclosure takes the hinge assembly 100 switching from the unfolded state to the folded state as an example to describe the specific movement process. As shown in FIG. 4, the hinge assembly 100 is in the unfolded state shown in FIG. 4, the projection and the recessed part are cooperated and located at the position shown in FIG. 4. At this time, under the action of the external force, the first rotating part 11 rotates, the hinge assembly 100 is switched to the bent state, cooperating of the projection and the recessed part is released, and the sliding member 21 will slide from bottom to top in the direction shown as the arrow in FIG. 5, until the projection and the recessed part are cooperatively limited to the position shown in FIG. 5. At this time, the hinge assembly 100 can be limit in the bent state as shown in FIG. 6 as a whole. For example, at this time, the hinge assembly 100 is rotated by 30° relative to the state in FIG. 5. The external force continues to act, the cooperation of the projection and the recessed part is released, and the sliding member 21 can slide from bottom to top in the direction shown by the arrow in FIG. 7, until the projection and the recessed part are cooperatively limited to the position shown in FIG. 7. At this time, the hinge assembly 100 can be limit in the bent state as shown in FIG. 8 as a whole, for example, at this time, the hinge assembly 100 is rotated by 90° relative to the state in FIG. 5, the hinge assembly 100 is switched to the folded state as a whole.

It should be noted that in the embodiments provided in the present disclosure, it takes that the first limiting part 221 includes a projection, and the second limiting part 212 includes a recessed part as an example for description. In other embodiments, it may also be that the first limiting part 221 includes a recessed part and the second limiting part 212 includes a projection, and the number of the projection and the recessed part can refer to the embodiment provided in the present disclosure, which is not limited in the present disclosure. In some other embodiments, one of the first limiting part 221 and the second limiting part 212 may also include a hook, and the other of the first limiting part 221 and the second limiting part 212 includes a hook groove, and the position limitation is realized by the cooperation of the hook and the hook groove. The first limiting part 221 and the second limiting part 212 may also include other cooperated structures for position limitation, which will not be repeated herein.

Specifically, in order to improve the hand feel during the process of folding or unfolding the hinge assembly 100, the position limiting member 22 may further include an elastic part 222. The elastic part 222 may be arranged in a direction perpendicular to the axial direction of the first rotating part 11, namely it can be arranged in the direction shown by arrow B in FIG. 2. One end of the elastic part 222 is used for fixing, and the other end of the elastic part 222 may be connected to the first limiting part 221; in this way, during the sliding process of the sliding member 21, when the projection and the recessed part are in the separated state, the second limiting part 212 of the sliding member 21 can press against the first limiting part 221, and the elastic part 222 is compressed; and at the moment when the projection and the recessed part are about to cooperate, due to the gap provided by the recessed part, the elastic part 222 can be reset, to push the projection into the recessed part, to achieve position limitation. The elastic part 222 may include a compression spring or other flexible parts, which is not limited in the present disclosure.

Further, the hinge assembly 100 may further include a base body 3, the base body 3 may be arranged along the axial direction of the first rotating shaft 62, and the first rotating part 11 is rotatably connected with the base body 3, and one end of the elastic part 222 away from the first limiting part 221 may be fixedly connected to the base body 3; the sliding member 21 may be slidably connected to the base body 3. Specifically, the base body 3 may include a guiding member 31, and the sliding member 21 may include a second guiding groove 213. The guide member 31 can extend into the second guide groove, so that when the first rotating part 11 rotates relative to the base body 3, the guide member 31 and the second guide groove 213 are driven to slide relative to each other along the axial direction of the first rotating part 11. The sliding member 21 slides along the axial direction of the first rotating part 11. The sliding member 21, the position limiting member 22 and the rotating assembly 1 are connected through the base body 3, which is beneficial to the integration and centralization of the hinge assembly 100. In other embodiments, the sliding member 21, the position limiting member 22, and the rotating assembly 1 may also be connected to the housing of the target device or other fixing members, which is not limited in the present disclosure. The base body 3 may include a bracket 32 and a cover body 33 assembled with the bracket 32, the guide member 31 may be arranged on the bracket 32, and the cover body 33 may be used for covering, and the sliding member 21 is arranged between the cover body 33 and the bracket 32, to improve the overall aesthetics of the base body 3. The bracket 32 and the cover body 33 can be assembled to form a shaft hole, and the first rotating part 11 can be rotatably connected with the shaft hole. In some other embodiments, it may also be that the base body 3 includes the second guide groove 213, and the sliding member 21 includes the guide member 31, which is not limited in the present disclosure.

In each of the foregoing embodiments, as shown in FIGS. 9-12, the rotating assembly 1 may further include a mating part 12. The mating part 12 is located at an end of the rotating assembly 1 away from the first rotating part 11, and the first rotating part 11 is rotatably connected with the base body 3; or the first rotating part 11 can also be rotatably connected to a fixed base other than the hinge assembly 100. The hinge assembly 100 may further include a fixed support member 4, a first pull rod 5, a screen support member 6 and a second pull rod 7. The fixed support member 4 may be arranged at one side of the base body 3, and the fixed support member 4 and the base body 3 are arranged side by side in a direction perpendicular to the axial direction of the first rotating part 11. The first rotating part 11 of the rotating assembly 1 is rotatably connected to the base body 3, and can extend in a direction perpendicular to the axial direction of the first rotating part 11, such that the mating part 12 and the fixed support member 4 are slidably connected in a direction perpendicular to the axial direction of the first rotating part 11; the fixed support member 4 can subsequently be used to connect with the housing of the foldable electronic device configured with the hinge assembly 100, then through the movement of the fixed support member 4 relative to the base body 3, the housing is driven to move relative to the base body 3, thereby realizing the bending and unfolding of the foldable electronic device. One end of the first pull rod 5 is movably connected to the base body 3, the other end of the first pull rod 5 is rotatably connected to the fixed support member 4. The extension direction of the first pull rod 5 is the same as the extension direction of the rotating assembly 1. The screen support member 6 and the fixed support member 4 are stacked. One end of the second pull rod 7 is rotatably connected to the first pull rod 5, and the other end of the second pull rod 7 is rotatably connected with the screen support member 6.

Based on this, when an external force is acted on the hinge assembly 100, the first rotating part 11 will rotate relative to the base body 3. In order to avoid jamming, the mating part 12 will slide relative to the fixed support member 4. Due to the relative movement of the first pull rod 5 and the base body 3, the fixed support member 4 can move relative to the base body 3. The fixed support member 4 can be driven away from or close to the base body 3 through the action of the first pull rod 5. Due to the rotation of the first pull rod 5 and the change in the displacement of the first pull rod 5 in the direction perpendicular to the axial direction of the first rotating part 11, the second pull rod 7 can rotate relative to the first pull rod 5, and the screen support member 6 can be driven to rotate relative to the base body 3 through the other end of the second pull rod 7. Therefore, when the flexible screen of the foldable electronic device configured with the hinge assembly 100 is set on the screen support member 6, on the one hand, the screen support member 6 can provide support to reduce deformation, and on the other hand, the rotation of the screen support member 6 relative to the base body 3 can avoid interference in the process of folding the flexible screen and affect the flexible screen.

In the embodiment provided by the present disclosure, a set of the fixed support member 4, the first pull rod 5 and the screen support member 6 that cooperate with each other are arranged at one side of the base body 3; another set of the fixed support member 4, the first pull rod 5 and the screen support member 6 that cooperate with each other is arranged at an opposite side of the base body 3. One fixed support member 4 can be used to connect with the housing of one side of the electronic device, and the other fixed support member 4 can be used to connect to the housing of other side of the electronic device, so that the hinge assembly 100 can drive the housings at two sides of the electronic device close to each other or away from each other at the same time. The mating part 12 may include a guide rail, and the fixed support member 4 may include a sliding groove. The sliding groove cooperates with the guide rail to realize a sliding connection between the fixed support member 4 and the mating part 12. In order to accommodate the mating part 12, the fixed support member 4 may include a recessed groove, and the sliding groove may be provided on the inner wall of the recessed groove. In other embodiments, it may also be that the mating part 12 includes a sliding groove, and the fixed support member 4 includes a guide rail, which is not limited in the present disclosure.

The following will exemplify each structure. The first pull rod 5 may include a moving part 51, a second rotating part 52, and a connecting part 53. The connecting part 53 connects the moving part 51 and the second rotating part 52, the moving part 51 is movably connected with the base body 3, the second rotating part 52 is rotatably connected with the fixed support member 4. Based on this, when the moving part 51 moves relative to the base body 3, the second rotating part 52 can be pushed to move along the length direction of the first pull rod 5. The second rotating part 52 can push the fixed support member 4 to move close to or away from the base body 3 whiling driving the fixed support member 4 to rotate relative to the base body 3. In a case where the fixed support members 4 are arranged at two sides of the base body 3, when the hinge assembly 100 is switched from the folded state to the unfolded state, the fixed support members 4 can move close to the base body 3, and the fixed support members 4 at two sides can be close to each other on the back of the base body 3 to cover the base body 3, so that the back of the hinge assembly 100 is flat to improve the aesthetics; and when the hinge assembly 100 is switched from the unfolded state to the folded state, the fixed support members 4 can move away from the base body 3 until the state shown in FIG. 8, to prevent the fixed support member 4 from interfering the flexible screen.

Regarding the movable connection between the moving part 51 and the base body 3, specifically, the base body 3 may include a first arc-shaped track 34, and the moving part 51 may include an arc-shaped moving part 51, such as a semicircular arc-shaped moving part 51. The arc-shaped moving part 51 extends from the end into the first arc-shaped track 34, to cooperate with the first arc-shaped track 34. Based on this, when the arc-shaped moving part 51 moves in the first arc-shaped track 34, on one hand, the relative rotation of the first pull rod 5 and the base body 3 can be realized, and at the same time, the position change between the arc-shaped moving part 51 and the first arc-shaped track 34 can make the second rotating part 52 to move away from or close to the base body 3, thereby driving the fixed support member 4 to move away from or close to the base body 3. To facilitate installation, the bracket 32 of the base body 3 may include a first arc-shaped recessed part 321, and the cover 33 of the base body 3 may include a first arc-shaped protrusion 331. For example, the first arc-shaped recessed part 321 may be arranged in a semicircular shape. The first arc-shaped protrusion 331 can also be arranged in a semicircular shape, but the radius of the first arc-shaped protrusion 331 is smaller than the radius of the first arc-shaped recessed part 321, so that when the first arc-shaped protrusion 331 is cooperated with the first arc-shaped recessed part 321, the first arc-shaped track 34 can be formed due to the difference in radius. Only the first arc-shaped protrusion 331 and the first arc-shaped recessed part 321 provided in a semicircular shape is taken as an example for description, in other embodiments, other forms can also be presented, as long as displacement changes can be generated when the moving part 51 rotates relative to the first arc-shaped track 34.

The connecting part 53 can be recessed inward from the surface facing the screen support member 6 toward the direction away from the screen support member 6, so as to increase the spatial distance between the connecting part 53 and the screen support member 6, which provides space for arranging the second pull rod 7, and reduces the difficulty of assembling the second pull rod 7. The connecting part 53 may include a through hole 531. The through hole 531 may penetrate through the connecting part 53 along the axial direction of the first rotating part 11. The hinge assembly 100 may also include a second rotating shaft 8. The second rotating shaft 8 penetrates through the through hole 531 on the connecting part 53 and is rotationally connected with the second pull rod 7, so that the rotational connection between the second pull rod 7 and the first pull rod 5 can be realized. Based on this, the first pull rod 5 can push the screen support member 6 to move through the second pull rod 7, and at the same time, the jamming between the first pull rod 5 and the second pull rod 7 can be avoided.

Regarding the rotational connection between the second pull rod 7 and the screen support member 6, specifically, the screen support member 6 may include a notch 61 and a first rotating shaft 62 extending inward from the inner wall of the notch 61. One end of the second pull rod 7 away from the connecting part 53 is rotatably connected with the first rotating shaft 62, and the end of the second pull rod 7 away from the connecting part 53 can be located in the notch 61. Therefore, when the first pull rod 5 moves, one end of the second pull rod 7 away from the connecting part 53 can be acted on the screen support member 6, to drive the screen support member 6 to rotate relative to the base body 3. In the embodiments of the present disclosure, the notch 61 and the first rotating shaft 62 provided in the notch 61 are taken as an example to illustrate the rotational connection between the second pull rod 7 and the screen support member 6. In other embodiments, the screen support member 6 and the second pull rod 7 can also be rotatably connected in other manners. For example, the surface of the screen support member 6 facing the connecting part 53 can extend toward the connecting part 53 to form a mounting part, and a shaft hole is formed on the mounting part, and then the second pull rod 7 and the mounting part are rotatably connected by the first rotating shaft 62. Compared with this technical solution, the embodiment of the present disclosure adopts the form of the notch 61, which can increase the space for the arrangement of the second pull rod 7 and is beneficial to the thinning of the thickness of the hinge assembly 100, which facilitates the development trend of lighter and thinner electronic devices equipped with the hinge assembly 100.

In the embodiment provided by the present disclosure, the second pull rod may include a first hinged part 71 and a second hinged part 72. The first hinged part 71 may be rotatably connected with the screen support member 6, and the second hinged part 72 may be rotatably connected with the first pull rod 5. The first hinged part 71 may be arranged in a cylindrical shape, the second pull rod 7 includes two second hinged parts 72 spaced apart. Each second hinged part 72 is connected to the first hinged part 71. In addition, a plane of an axis of the first hinged part 71 is parallel with a plane of an axis of the second hinged part 72, the two planes are separated from each other by a certain distance, and the plane of the axis of the second hinged part 72 is away from the screen support member 6 relative to the plane of the axis of the first hinged part 71. Based on this, when the first pull rod 5 drives the second pull rod 7 to rotate, the hinged part of the second pull rod 7 will always cooperate with the screen support member 6, and during the rotation of the second pull rod 7, the second hinged part 72 will always be at a position far away from the screen support member 6. When the hinge assembly 100 is switched to the folded state as shown in FIG. 12, the second hinged part 72 will be outward relative to the screen support member 6, which can provide enough space for the flexible screen provided on the screen support member, ensure that the bending radius of the bent flexible screen is maximized, effectively reduce the bending stress of the flexible screen.

In the above embodiment, in order to guide and limit the movement of the screen support member 6 relative to the base body 3, the hinge assembly 100 may further include a support plate cover 9. The support plate cover 9 may include a second arc-shaped protrusion 91. The fixed support member 4 may include a second arc-shaped recessed part 41. The second arc-shaped recessed part 41 is located at an edge of the side of the fixed support member 4 away from the first pull rod 5. The second arc-shaped protrusion 91 of the support plate cover 9 may be disposed in the second arc-shaped recessed part 41, to cooperate with the second arc-shaped recessed part 41 to form a second arc-shaped track. The screen support member 6 may include a support body 63 and an arc-shaped guide member 64. The support body 63 may be provided in a plate shape and stacked with the fixed support member 4. The arc-shaped guide member 64 is provided at the edge of the support body 63, and the arc-shaped guide member 64 is cooperated with the second arc-shaped track. Based on this, during the movement of the fixed support member 4 relative to the base body 3, the screen support member 6 can be moved adaptively to avoid jamming.

The second arc-shaped protrusion 91 may be arranged in a semi-circular shape, the cross-section of the second arc-shaped recessed part 41 may be arranged in a semi-circular shape, and the radius of the second arc-shaped protrusion 91 may be smaller than that of the second arc-shaped recessed part 4. Therefore, when the second arc-shaped protrusion 91 is located in the second arc-shaped recessed part 41, a second arc-shaped track can be formed. The arc-shaped guide member 64 of the screen support member 6 may be an arc-shaped plate with a semicircular cross section. Only both the second arc-shaped track and the arc-shaped guide member 64 being semi-circular shape are taken as an example for illustration. In other embodiments, the second arc-shaped track and the arc-shaped guide member 64 may also be in other arcs, which is not limited in the present disclosure.

Figure 12:
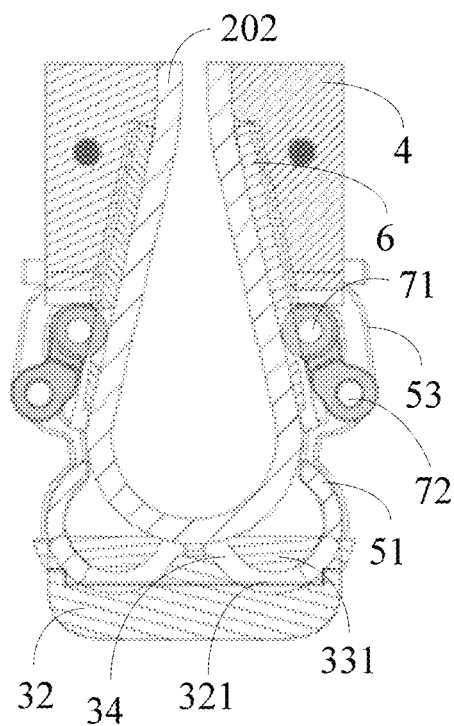
FIG. 12 is a partial cross-sectional schematic diagram showing a hinge assembly in a folded state according to an exemplary embodiment.

In the embodiment provided by the present disclosure, the thickness of the fixed support member 4 increases from the side close to the base body 3 to the side away from the base body 3, that is, the thickness of the fixed support member 4 increases in the direction from left to right in FIG. 2, and the thickness of the fixed support member 4 increases in the direction from bottom to top in FIG. 12. In this way, as shown in FIG. 12, when the hinge assembly 100 is switched to the folded state, the bending radius of the bending part of the flexible screen is the largest, and the flexible screen away from the bending part will be arranged oppositely, so that by setting the thickness of the fixed support member 4 in an increasing way, the area with the smaller thickness of the fixed support member 4 is closer to the bending area of the flexible screen than the area with the larger thickness, so as to adapt to the shape change of the flexible screen from the unfolded state to the folded state, and avoid the fixed support member 4 from extruding the flexible screen. When the flexible screen is switched from the folded state to the unfolded state, the space gap between the thinner area of he fixed support member 4 and the screen support plate can be compensated by the second pull rod 7, and the screen support plate is supported by the second pull rod 7.

In each of the foregoing embodiments, in order to achieve synchronous movement on both sides of the base body 3, the rotating shaft assembly may include a first rotating shaft assembly and a second rotating shaft assembly. The first rotating shaft assembly and the second rotating shaft assembly may be arranged oppositely with respect to the base body 3. The first rotating shaft assembly and the second rotating shaft assembly may respectively include the first rotating part 11, the first guide groove 111 and the mating part 12. The sliding member 21 may include a plurality of protruding parts 211. At least one of the protruding parts 211 is cooperated with the first guide groove 111 of the first rotating shaft assembly. At least one of the protruding parts 211 is cooperated with the first guide groove 111 of the second rotating shaft assembly. The mating part 12 of the first rotating shaft assembly can be may be slidably connected with the fixed support member 4 on the same side of the first rotating shaft assembly. The mating part 12 of the second rotating shaft assembly may be slidably connected with the fixed support member 4 on the same side of the second rotating shaft assembly. Based on this, when the first rotating part 11 of any one of the first rotating assembly 1 and the second rotating assembly 1 rotates, the sliding member 21 can be used to drive the other of the first rotating assembly 1 and the second rotating assembly 1 to rotate synchronously, so as to realize synchronous folding of two sides of the hinge assembly 100.

Figure 13:
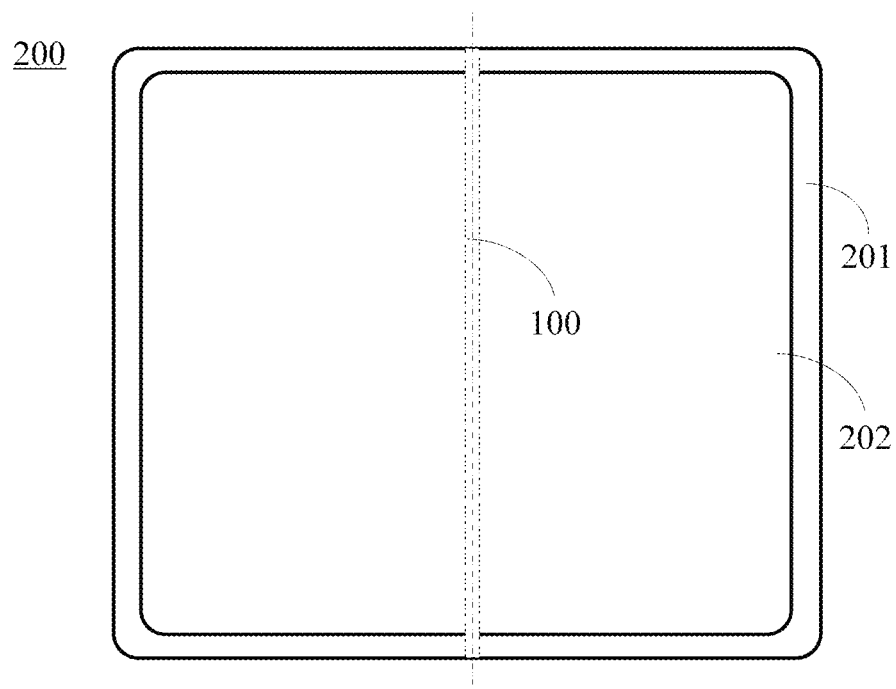
FIG. 13 is a schematic diagram showing a state of an electronic device according to an exemplary embodiment.
Figure 14:
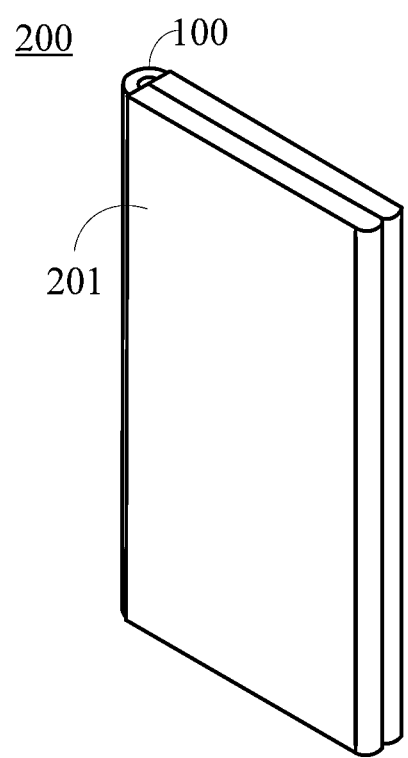
FIG. 14 is a schematic diagram showing another state of an electronic device according to an exemplary embodiment.

Based on the technical solutions of the present disclosure, as shown in FIG. 13 and FIG. 14, the present disclosure also provides an electronic device 200. The electronic device 200 may include a housing 201, a flexible screen 202, and a hinge assembly 100. The flexible screen 202 may be laid flat on the housing 201. The end of the rotating assembly 1 of the hinge assembly 100 away from the first rotating part 11 is used to connect to the housing 201. For example, the first rotating part 11 may be connected to the housing 201 through a fixed support member 4 to drive the housing 201 to rotate, to realize the switching between the unfolded state shown in FIG. 13 and the folded state shown in FIG. 14 of the electronic device 200.

Specifically, the housing 201 may include a left-side housing and a right-side housing, the flexible screen 202 is laid flat on the left-side housing and the right-side housing, and the left-side housing may be connected with the fixed support member 4 on one side of the hinge assembly 100, and the right-side housing can be connected with the fixed support member 4 on the other side of the hinge assembly 100. Based on this, when the hinge assembly 100 is bent, the two fixed support members 4 of the hinge assembly 100 will approach or move away from each other, thereby driving the left-side housing and the right-side housing to approach or move away from each other, so that the flexible screen 202 is bent or unfolded synchronously.

Optionally, one of the first limiting part and the second limiting part includes at least one projection arranged side by side along the axial direction, and the other of the first limiting part and the second limiting part includes at least one recessed part arranged side by side along the axial direction;

wherein, an identical projection is used to cooperate with different recessed parts to limit the first rotating part in different angles.

Optionally, the position limiting member includes an elastic part, the elastic part is arranged in a direction perpendicular to the axial direction of the first rotating part, and one end of the elastic part is used for fixing, the other end of the elastic part is connected to the first limiting part or the second limiting part.

Optionally, the hinge assembly further includes:
a base body, wherein the base body is arranged along the axial direction of the first rotating part, and the first rotating part is rotatably connected with the base body;
one of the base body and the sliding member includes a guide member, and the other of the base body and the sliding member includes a second guide groove cooperated with the guide member.

Optionally, the base body includes a bracket and a cover body assembled with the bracket, the guide member is provided on the bracket, and the first rotating part is rotatably connected to a shaft hole formed by assembling the bracket and the cover body.

Optionally, the rotating assembly further includes a mating part away from the first rotating part, and the first rotating part is used to rotatably connected to an external base body or the base body included in the hinge assembly;
the hinge assembly further includes:
a fixed support member, wherein the fixed support member and the mating part are slidably connected along a direction perpendicular to the axial direction of the first rotating part;
a first pull rod, having one end movably connected with the base body, and the other end rotatably connected with the fixed support member;
a screen support member, stacked with the fixed support member;
a second pull rod, having one end rotatably connected with the first pull rod, and the other end rotatably connected with the screen support member;
wherein, the first pull rod pushes the fixed support member to move when moving relative to the base body, the fixed support member and the mating part slide relative to each other, and the screen support member is driven to rotate relative to the base body through the second pull rod.

Optionally, the first pull rod includes a moving part, a second rotating part and a connecting part, the connecting part connects the moving part and the second rotating part, the moving part is movably connected with the base body, the second rotating part is rotatably connected with the fixed support member, and the connecting part is rotatably connected with the second pull rod.

Optionally, the connecting part is recessed inward from a surface facing the screen support member toward a direction away from the screen support member.

Optionally, the base body includes a first arc-shaped track, the moving part includes an arc-shaped moving part, and the arc-shaped moving part is cooperated with the first arc-shaped track, when the arc-shaped moving part moves along the first arc-shaped track, the fixed support member is gradually moved away from or close to the base body, and the mating part and the fixed support member slide relative to each other.

Optionally, the base body includes a bracket and a cover body, the bracket includes a first arc-shaped recessed part, the cover body includes a first arc-shaped protrusion, the first arc-shaped protrusion is disposed in the first arc-shaped recessed part to cooperate to form the first arc-shaped track.

Optionally, the connecting part includes a through hole, the hinge assembly further includes a second rotating shaft, the second rotating shaft passes through the through hole and is rotatably connected with the second pull rod.

Optionally, the screen support member includes a notch and a first shaft extending from an inner wall of the notch, and the second pull rod is rotatably connected with the first shaft.

Optionally, the second pull rod includes a first hinged part and a second hinged part, the first hinged part is rotatably connected with the screen support member, and the second hinged part is rotatably connected with the first pull rod.

In one or more examples, the second hinged part is arranged in a cylindrical shape, two first hinged parts are connected to the second hinged part at intervals, and a plane of an axis of the first hinged part is parallel with and separated from a plane of an axis of the second hinged part, and the plane of the axis of the second hinged part is away from the screen support member relative to the plane of the axis of the first hinged part.

Optionally, the fixed support member includes a second arc-shaped recessed part, the second arc-shaped recessed part is located at an edge of the fixed support member away from the first pull rod, the hinge assembly further includes a support plate cover, the support plate cover includes a second arc-shaped protrusion, the second arc-shaped protrusion is disposed in the second arc-shaped recessed part to cooperate to form a second arc-shaped track.

In one or more examples, the screen support member includes a support body and an arc-shaped guide member, the support body and the fixed support member are stacked, and the arc-shaped guide member is cooperated with the second arc-shaped track.

Optionally, a set of the fixed support member, the first pull rod and the screen support member that cooperate with each other are arranged at one side of the base body; another set of the fixed support member, the first pull rod and the screen support member that cooperate with each other is arranged at an opposite side of the base body.

Optionally, one of the fixed support member and the mating part includes a sliding groove, and the other of the fixed support member and the mating part includes a guide rail.

Optionally, a thickness of the fixed support member increases from a side close to the base body to a side away from the base body.

Optionally, the rotating assembly includes a first rotating shaft assembly and a second rotating shaft assembly, the first rotating shaft assembly and the second rotating shaft assembly are disposed oppositely, and the first rotating shaft assembly and the second rotating shaft assembly respectively include the first rotating part and the first guide groove provided in the first rotating part.

In one or more examples, the sliding member includes a plurality of the protruding parts, wherein at least one of the protruding parts is cooperated with the first guide groove on the first rotating part of the first rotating shaft assembly, and at least one of the protruding parts is cooperated with the first guide groove on the first rotating part of the second rotating shaft assembly.

Other embodiments of the disclosure will be apparent to those skilled in the art from consideration of the specification and practice of the disclosure disclosed here. This disclosure is intended to cover any variations, uses, or adaptations of the disclosure following the general principles thereof and including known knowledge or conventional technical means in the art not disclosed in the present disclosure. It is intended that the specification and embodiments are considered as exemplary only, with a true scope and spirit of the disclosure being indicated by the following claims.

The technical solution provided by the embodiments of the present disclosure may include the following beneficial effects.

As known from the above embodiments, in the technical solution of the present disclosure, through the coordinated position limiting effect between the first limiting part and the second limiting part of the hovering mechanism, the rotation of the rotating assembly can be restricted to maintain the hinge assembly at the target position. Therefore, when the hinge assembly is applied to a foldable electronic device subsequently, the foldable electronic device can be maintained in a target bending state, which enriches the folding manner of the foldable electronic device.

It will be appreciated that the present disclosure is not limited to the exact construction that has been described above and illustrated in the accompanying drawings, and that various modifications and changes may be made without departing from the scope thereof. It is intended that the scope of the disclosure only be limited by the appended claims.

What is claimed is:

1. A hinge assembly, comprising:
    a rotating assembly, wherein the rotating assembly comprises a first rotating part, and the first rotating part comprises a first guide groove extending obliquely around an axial direction of the first rotating part; and
    a hovering mechanism, wherein the hovering mechanism comprises a sliding member and a position limiting member, the sliding member comprises a protruding part, the protruding part extends into the first guide groove, and the first rotating part drives the sliding member to move along the axial direction of the first rotating part when rotating, the position limiting member comprises a first limiting part, and the sliding member comprises a second limiting part cooperated with the first limiting part;
    wherein rotation of the first rotating part is limited when the first limiting part is cooperated with the second limiting part, and the limiting is released when the first limiting part is separated from the second limiting part,
    wherein the rotating assembly further comprises a mating part away from the first rotating part, and the first rotating part is used to rotatably connected to an external base body or a base body comprised in the hinge assembly;
    wherein the hinge assembly further comprises:
    a fixed support member, wherein the fixed support member and the mating part are slidably connected along a direction perpendicular to the axial direction of the first rotating part;
    a first pull rod, having one end movably connected with the base body, and the other end rotatably connected with the fixed support member;
    a screen support member, stacked with the fixed support member;
    a second pull rod, having one end rotatably connected with the first pull rod, and the other end rotatably connected with the screen support member;
    wherein the first pull rod pushes the fixed support member to move when moving relative to the base body, the fixed support member and the mating part slide relative to each other, and the screen support member is driven to rotate relative to the base body through the second pull rod.

2. The hinge assembly according to claim 1, wherein the position limiting member comprises an elastic part, the elastic part is arranged in a direction perpendicular to the axial direction of the first rotating part, and one end of the elastic part is used for fixing, the other end of the elastic part is connected to the first limiting part or the second limiting part.

3. The hinge assembly according to claim 1, further comprising:
    a base body, wherein the base body is arranged along the axial direction of the first rotating part, and the first rotating part is rotatably connected with the base body;
    wherein one of the base body and the sliding member comprises a guide member, and the other of the base body and the sliding member comprises a second guide groove cooperated with the guide member.

4. The hinge assembly according to claim 3, wherein the base body comprises a bracket and a cover body assembled with the bracket, the guide member is provided on the bracket, and the first rotating part is rotatably connected to a shaft hole formed by assembling the bracket and the cover body.

5. The hinge assembly according to claim 1 wherein the first pull rod comprises a moving part, a second rotating part and a connecting part, the connecting part connects with the moving part and the second rotating part, the moving part is movably connected with the base body, the second rotating part is rotatably connected with the fixed support member, and the connecting part is rotatably connected with the second pull rod.

6. The hinge assembly according to claim 5, wherein the connecting part is recessed inward from a surface facing the screen support member toward a direction away from the screen support member.

7. The hinge assembly according to claim 5, wherein the base body comprises a first arc-shaped track, the moving part comprises an arc-shaped moving part, and the arc-shaped moving part is cooperated with the first arc-shaped track, when the arc-shaped moving part moves along the first arc-shaped track, the fixed support member is gradually moved away from or close to the base body, and the mating part and the fixed support member slide relative to each other.

8. The hinge assembly according to claim 7, wherein the base body comprises a bracket and a cover body, the bracket comprises a first arc-shaped recessed part, the cover body comprises a first arc-shaped protrusion, the first arc-shaped protrusion is disposed in the first arc-shaped recessed part to cooperate to form the first arc-shaped track.

9. The hinge assembly according to claim 5, wherein the connecting part comprises a through hole, the hinge assembly further comprises a second rotating shaft, the second rotating shaft passes through the through hole and is rotatably connected with the second pull rod.

10. The hinge assembly according to claim 1, wherein the screen support member comprises a notch and a first shaft extending from an inner wall of the notch, and the second pull rod is rotatably connected with the first shaft.

11. The hinge assembly according to claim 1, wherein the second pull rod comprises a first hinged part and a second hinged part, the first hinged part is rotatably connected with the screen support member, and the second hinged part is rotatably connected with the first pull rod;
    wherein the second hinged part is arranged in a cylindrical shape, two first hinged parts are connected to the second hinged part at intervals, and a plane of an axis of the first hinged parts is parallel with and separated from a plane of an axis of the second hinged part, and the plane of the axis of the second hinged part is away from the screen support member relative to the plane of the axis of the first hinged part.

12. The hinge assembly according to claim 8, wherein the fixed support member comprises a second arc-shaped recessed part, the second arc-shaped recessed part is located at an edge of the fixed support member away from the first pull rod, the hinge assembly further comprises a support plate cover, the support plate cover comprises a second arc-shaped protrusion, the second arc-shaped protrusion is disposed in the second arc-shaped recessed part to cooperate to form a second arc-shaped track;

wherein the screen support member comprises a support body and an arc-shaped guide member, the support body and the fixed support member are stacked, and the arc-shaped guide member is cooperated with the second arc-shaped track.

13. The hinge assembly according to claim 1 wherein a set of the fixed support member, the first pull rod and the screen support member that cooperate with each other are arranged at one side of the base body;

wherein another set of the fixed support member, the first pull rod and the screen support member that cooperate with each other is arranged at an opposite side of the base body.

14. The hinge assembly according to claim 1, wherein one of the fixed support member and the mating part comprises a sliding groove, and the other of the fixed support member and the mating part comprises a guide rail.

15. The hinge assembly according to claim 1, wherein a thickness of the fixed support member increases from a side close to the base body to a side away from the base body.

16. The hinge assembly according to claim 1, wherein the rotating assembly comprises a first rotating shaft assembly and a second rotating shaft assembly, the first rotating shaft assembly and the second rotating shaft assembly are disposed oppositely, and the first rotating shaft assembly and the second rotating shaft assembly respectively comprise the first rotating part and the first guide groove provided in the first rotating part;

wherein the sliding member comprises a plurality of the protruding parts, wherein at least one of the protruding parts is cooperated with the first guide groove on the first rotating part of the first rotating shaft assembly, and at least one of the protruding parts is cooperated with the first guide groove on the first rotating part of the second rotating shaft assembly.

17. The hinge assembly according to claim 1, wherein one of the first limiting part and the second limiting part comprises at least one projection arranged side by side along the axial direction of the first rotating part, and the other of the first limiting part and the second limiting part comprises at least one recessed part arranged side by side along the axial direction of the first rotating part;

wherein the projection is used to cooperate with the recessed part to limit the first rotating part in different angles.

18. An electronic device, comprising:
a housing;
a flexible screen; and
a hinge assembly, wherein the hinge assembly comprises:
  a rotating assembly, wherein the rotating assembly comprises a first rotating part, and the first rotating part comprises a first guide groove extending obliquely around an axial direction of the first rotating part; a hovering mechanism, wherein the hovering mechanism comprises a sliding member and a position limiting member, the sliding member comprises a protruding part, the protruding part extends into the first guide groove, and the first rotating part drives the sliding member to move along the axial direction of the first rotating part when rotating, the position limiting member comprises a first limiting part, and the sliding member comprises a second limiting part cooperated with the first limiting part;
wherein, rotation of the first rotating part is limited when the first limiting part is cooperated with the second limiting part, and the limiting is released when the first limiting part is separated from the second limiting part, wherein an end of the rotating assembly away from the first rotating part is used to be connected to the housing to drive the housing to rotate,
wherein the rotating assembly further comprises a mating part away from the first rotating part, and the first rotating part is used to rotatably connected to an external base body or a base body comprised in the hinge assembly;
wherein the hinge assembly further comprises:
  a fixed support member, wherein the fixed support member and the mating part are slidably connected along a direction perpendicular to the axial direction of the first rotating part;
  a first pull rod, having one end movably connected with the base body, and the other end rotatably connected with the fixed support member;
  a screen support member, stacked with the fixed support member;
  a second pull rod, having one end rotatably connected with the first pull rod, and the other end rotatably connected with the screen support member;
  wherein the first pull rod pushes the fixed support member to move when moving relative to the base body, the fixed support member and the mating part slide relative to each other, and the screen support member is driven to rotate relative to the base body through the second pull rod.

* * * * *